United States Patent [19]
Misra et al.

[11] Patent Number: 5,960,270
[45] Date of Patent: Sep. 28, 1999

[54] METHOD FOR FORMING AN MOS TRANSISTOR HAVING A METALLIC GATE ELECTRODE THAT IS FORMED AFTER THE FORMATION OF SELF-ALIGNED SOURCE AND DRAIN REGIONS

[75] Inventors: Veena Misra; Suresh Venkatesan; Christopher C. Hobbs; Brad Smith; Jeffrey S. Cope; Earnest B. Wilson, all of Austin, Tex.

[73] Assignee: Motorola, Inc., Schaumburg, Ill.

[21] Appl. No.: 08/907,990

[22] Filed: Aug. 11, 1997

[51] Int. Cl.[6] .................................................. H01L 21/336
[52] U.S. Cl. ........................ 438/197; 438/585; 438/586; 438/595; 438/596
[58] Field of Search .................................... 438/197, 585, 438/586, 595, 596

[56] References Cited

U.S. PATENT DOCUMENTS

| | | | |
|---|---|---|---|
| 5,391,510 | 2/1995 | Hsu et al. ................................. | 437/44 |
| 5,393,681 | 2/1995 | Witek et al. ............................. | 437/40 |
| 5,434,093 | 7/1995 | Chau et al. .............................. | 437/41 |
| 5,447,874 | 9/1995 | Grivna et al. ............................ | 437/40 |
| 5,716,861 | 2/1998 | Moslehi .................................. | 437/40 |

Primary Examiner—John F. Niebling
Assistant Examiner—Lynne A. Gurley
Attorney, Agent, or Firm—Keith E. Witek

[57] ABSTRACT

A method for forming a metal gate MOS transistor begins by forming source and drain electrodes (26, 28, and/or 118) within a substrate (12 or 102). These source and drain regions (26, 28, and 118) are self-aligned to a lithographically-patterned feature (24 or 108). After formation of the source and drain regions, the features (24 and 108 are processed to fill these features with a metallic gate layer (28a or 128a). This metal layer (28a or 128a) is then chemically mechanically polished (CMPed) to form a metallic plug region (28b or 128b) within the features (24 or 108). The plug region (28b or 128b) is formed in either an inlaid or dual inlaid manner wherein this metallic plug region (28b or 128b) is self-aligned to the previously formed source and drain regions and preferably functions as a metal MOS gate region.

43 Claims, 8 Drawing Sheets

METHOD FOR FORMING AN MOS TRANSISTOR HAVING A METALLIC GATE ELECTRODE THAT IS FORMED AFTER THE FORMATION OF SELF-ALIGNED SOURCE AND DRAIN REGIONS

FIELD OF THE INVENTION

The present invention relates generally to semiconductor manufacturing, and more particularly to, forming a metal gate MOS transistor wherein self-aligned high temperature source and drain regions are formed before the formation of the metal gate.

BACKGROUND OF THE INVENTION

In the integrated circuit (IC) industry, metal-oxide-semiconductor (MOS) transistors have typically been formed utilizing polysilicon gate electrodes. Polysilicon material is typically preferred for use as an MOS gate electrode due to its thermal resistive properties (i.e., polysilicon can better withstand subsequent high temperature processing). Polysilicon's robustness during high temperature processing allows polysilicon to be high-temperature annealed along with source and drain regions. Furthermore, polysilicon's ability to block the ion implantation of dopant atoms into a channel region is advantageous. Due to the ion implantation blocking potential of polysilicon, polysilicon allows for the easy formation of self-aligned source and drain structures after gate patterning is completed.

However, polysilicon gate electrodes suffer from several disadvantages. First, polysilicon requires the ion implantation of different dopant atoms for p-channel transistors and n-channel transistors formed in a surface CMOS process. These different dopant atom species of the polysilicon gate electrodes are required in order to get the p-channel and n-channel transistors of a CMOS process to have compatible threshold voltages ($V_t$). Furthermore, most MOS transistors formed using a polysilicon gate technology require a threshold ($V_t$) adjust implant into the MOS channel region. This threshold adjust implant is of a high enough doping concentration to adversely impact the mobility of carriers through the channel region. Polysilicon gate electrodes are semiconductor materials that suffer from higher resistivities than most metal materials. Therefore, polysilicon materials operate at a much slower speed than metallic materials. To compensate for this higher resistance, polysilicon materials require extensive and expensive silicide processing in order to increase their speed of operation to acceptable levels. Furthermore, polysilicon materials suffer from a polysilicon depletion phenomenon whereby the effective gate oxide thickness (EOT) of polysilicon transistors is increased by polysilicon depletion. Also, polysilicon gate electrodes are sometimes disadvantageous due to lack of threshold voltage control when utilized in fully depleted silicon-on-insulator (SOI) structures.

Therefore, a need exists in the industry for a metal gate process which can replace polysilicon gate devices. However, metal gates cannot withstand the higher temperatures and oxidation ambients which can be withstood by conventional polysilicon gate electrodes. In addition, metal films cannot effectively block ion implantation of dopant atoms into a channel region whereby self-aligned source and drain electrodes cannot be readily formed using conventional implant processing when a metal gate is used. In addition, some metal films will not adequately adhere to surrounding layers when these metal materials are patterned to small geometries. Some metal films are difficult to lithographically pattern and etch via conventional processing due to the fact that the etching of these metal films may significantly damage underlying oxides thereby affecting device performance. Furthermore, through subsequent thermal processing of the integrated circuit (IC), instability and degradation of the gate oxide may occur due to chemical interaction between the metal and oxide at the metal-gate-to-gate-oxide interface.

Therefore, a need exists for a process which can be utilized to form a self-aligned MOS transistor having metal gate electrodes.

BRIEF DESCRIPTION OF THE DRAWINGS

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a process for forming a metal-gated metal-oxide semiconductor (MOS) transistor which contains self-aligned source and drain electrodes that are formed before forming the metal gate. In a first embodiment (see FIGS. 1–7), an opening feature is used to define locations of a source and drain regions wherein the source and drain regions are formed by thermally driving dopant atoms out from silicide regions (the silicide regions being segmented into source and drain segments in a self-aligned manner by the opening). These source and drain electrodes are therefore formed self-aligned to the opening by thermal diffusion whereby the opening can be subsequently filled with the metal gate electrode which is then self-aligned to the thermally diffused source and drain regions. Since the source and drain regions are thermally driven and thermally activated before formation of the metal gate, adverse thermal processing of the metal gate can be avoided.

In an alternate embodiment, a polysilicon or amorphous silicon dummy/temporary gate electrode is formed (see FIGS. 10–18). This temporary gate electrode is used as a mask for implanting self-aligned source and drain electrodes into the substrate. After the formation of these source and drain electrodes, a dielectric region is deposited and chemically mechanically polished (CMP) to expose a top portion of the temporary polysilicon gate electrode. The polysilicon dummy gate electrode structure is then removed to form a void where the polysilicon gate once was located. This void is then filled with a metal material gate region wherein the metal gate is aligned to the source and drain region by virtue of being formed in a location previously occupied by the self-aligned polysilicon dummy gate.

Figure 8:
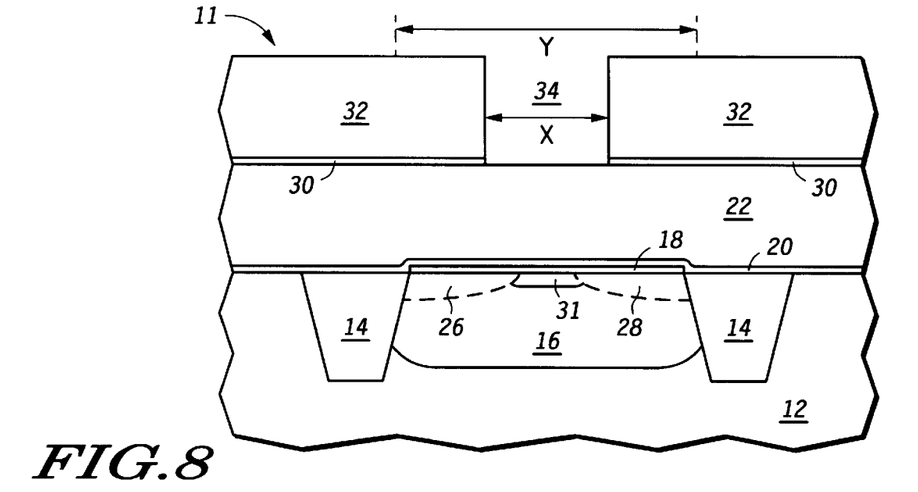
FIGS. 8 and 9 illustrate, in cross-sectional diagrams, a method for forming a self-aligned metal gate transistor and integrated metallic interconnect structures using a dual inlaid process in accordance with the present invention.
Figure 9:
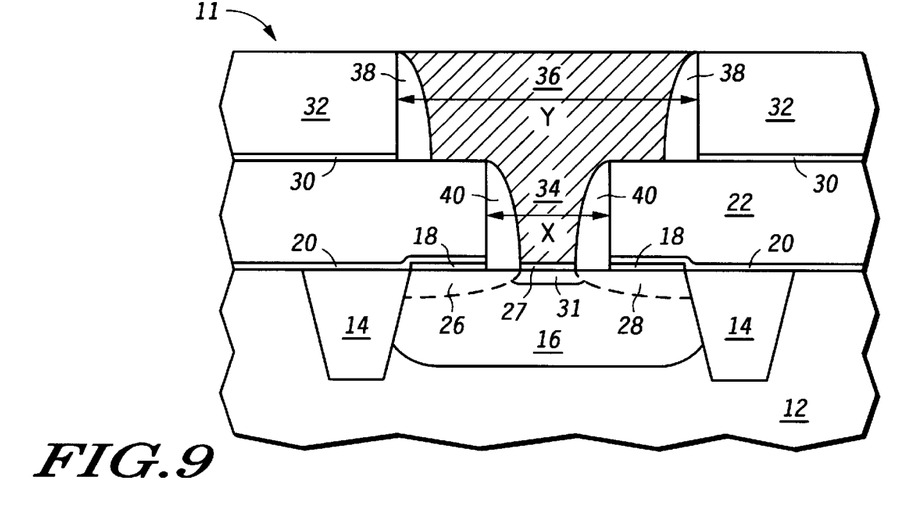

In addition, the metal gate processes taught herein can form self-aligned MOS transistors which are interconnected at the gate level using a novel dual inlaid process (see FIGS. 8–9). The novel dual inlaid structure has a bottom/lower dual inlaid region which forms the metallic gate electrodes of the MOS transistors (i.e., it does not form inter-metallic interconnects/contacts as are common in the prior art, but forms a gate electrode isolated from electrical contact by a gate dielectric). The dual inlaid structure also has an upper interconnect dual inlaid trench region connected to the underlying dual inlaid gate region for connecting the underlying metallic gate electrode to another active electric device or gate electrode on the integrated circuit (IC).

Additionally, the metal gate processing taught herein can also be used to form self-aligned MOS transistors and an interconnect layer within the same dielectric material using a novel two-pattern process (see FIGS. 19–22). In this embodiment, the gate and interconnect layers are formed simultaneously, although patterned separately, because both are metal-filled inlaid structures.

Since many metal materials are mid-gap work function materials, the same metal gate material can function as a gate electrode for both n-channel and p-channel transistors in a CMOS process without requiring adverse threshold voltage adjust implants and while maintaining threshold voltages ($V_t$) at compatible levels. These mid-gap metal gates also do not need both P and N dopants in different regions to support a CMOS gate function. The presence of metal gates allows the mobility of a channel region to be improved since the channel region will no longer need high dose threshold adjust implants and higher doping profiles in an MOS channel region. Metal gates are known to have greater conductivity than polysilicon electrodes and require no complicated silicide processing in order to perform at higher speeds of operation. Unlike polysilicon electrodes, metal electrodes do not suffer from polysilicon depletion which effects the effective gate oxide thickness (EOT) of an MOS transistor, thereby effecting the performance of the MOS device (i.e., thinner EOTs, while maybe resulting in greater leakage current, creates a faster-operating device). In addition, metal gate MOS devices are more advantageous for use as fully depleted silicon on insulator (SOI) devices since the threshold voltage of these devices can be more accurately controlled. In addition, metal gate electrodes are more compatible with high-k dielectrics than conventional polysilicon processing (high-k dielectrics being any dielectric with a dielectric constant greater than 5.0 and preferably greater than 20.0).

Furthermore, the process taught herein avoids many of the conventional disadvantages associated with metal gate technology. Since the metal gate is formed after the formation of high temperature source and drain regions, the limitation that metal gates cannot withstand high temperatures is not problematic when using the process taught herein. Furthermore, the prior art metal gate processes mostly result in non-self-aligned devices. However, the process taught herein results in fully self-aligned source and drain electrodes that are self-aligned to the subsequently formed metal gate. Even though metals, such as tungsten (W) and molybdenum (Mo), cannot effectively block the implanting of dopant atoms, the process taught herein still enables ion implanted formation of self-aligned source and drain regions. Since the metal gates taught herein are defined by a chemical mechanical polishing (CMP) process, no difficult metal etch processing is utilized. Due to this lack of metal etch processing, damage of oxide regions is reduced whereby performance of the MOS transistor is increased. When using the process taught herein, elimination or reduction of metal film delamination from adjacent oxide layers is achieved due to the formation of the metal gate into a semi-surrounding inlaid trench structure. Furthermore, the process taught herein eliminates the need to expose the metal-gate-to-gate-oxide interface to high temperatures whereby degradation of the gate oxide due to metal interaction is reduced or eliminated.

The present invention can be further understood with reference to FIGS. 1–22. FIGS. 1–7 illustrate a first metal gate embodiment, FIGS. 8 and 9 illustrate a second metal gate embodiment utilizing novel dual inlaid interconnect technology, and FIGS. 10–18 illustrate yet a third embodiment for forming a novel metal gate MOS transistor. FIGS. 19–22 illustrate a fourth embodiment for forming both the self-aligned, inlaid metal gates and an inlaid interconnect at the same time.

FIGS. 1–7 illustrate a metal gate MOS process used for forming a semiconductor device 10. Processing begins by providing a semiconductor substrate 12. Substrate 12 is preferably a silicon wafer, but may be one or more of a germanium substrate, a gallium arsenide substrate, a germanium-silicon substrate, a silicon on insulator substrate (SOI), epitaxial regions, indium phosphide substrates, other III-V compounds, silicon carbide substrates, or the like. Pad oxidation and nitride masking is utilized along with silicon etch processing to form trenches 14 in the substrate 12 of FIG. 1. These isolation trenches 14 are filled with a dielectric material in order to provide field isolation between active areas of the semiconductor device 10. In lieu of trench processing, local oxidation of silicon (LOCOS), polysilicon buffered LOCOS, or other field isolation schemes may be utilized in the embodiments taught herein.

Figure 1:
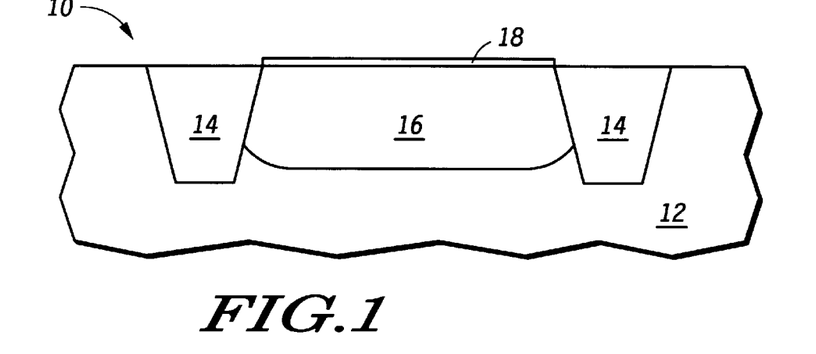
FIGS. 1–7 illustrate, in cross-sectional diagrams, a method for forming a self-aligned metal gate MOS transistor in accordance with the present invention.

After formation of the trench regions 14, CMOS well processing is performed. FIG. 1 illustrates that one or more of a p-well and/or an n-well is formed in the substrate wherein, for simplicity of illustration, FIG. 1 illustrates only a single well region 16.

After formation of the well regions, a selective growth process is used to selectively form a silicide region 18 overlying the well region 16. It is important to note that this silicide region is formed over both p-wells and n-wells in the substrate 12 and is not formed over the trench regions 14. In a preferred form, layer 18 is one of either cobalt silicide ($CoSi_2$) or nickel silicide ($NiSi_2$) since these two silicide materials are superior materials when used for out-diffusing dopant atoms to form silicon PN junctions. However, titanium silicide or other known silicides may be used for form the region 18 in FIG. 1. Preferably, the thickness of silicide layer 18 is roughly 300–400 angstroms. Since the layer 18 will subsequently be utilized to form both n-type source and drain regions and p-type source and drain regions via thermal diffusion, a double masking step and double ion implant process into different regions of the layer 18 is utilized to form both p-doped regions and an n-doped regions of layer 18. If only n-channel or p-channel transistors are formed on one IC, then insitu doping of the silicide layer 18 may be performed with one of either n-type impurities or p-type impurities. To form n-channel transistors, donor atoms such as phosphorus, arsenic, and/or antimony are ion implanted into the silicide layer 18. To form n-channel transistors, acceptor atoms such as boron, $BF_2$, and/or indium are ion implanted into the silicide layer 18.

In order to from lightly doped drain (LDD) region in a self-aligned manner, various regions of the silicide layer 18 may be implanted with two species, such as phosphorous and arsenic. This two-species doping will enable outdiffusion of both highly doped drain regions and lightly doped drain regions within the same thermal process due to differences in coefficients of diffusion for different dopant atoms. In summary, p-channel active areas in n-type wells contain a layer 18 that is ion implanted with p-type impurities (e.g., boron), an n-channel active areas within p-wells contain a layer 18 that is implanted with n-type impurities. Preferably, at this time in the process flow, a substantial portion of the ion implant dopant dose should be contained within the silicide region 18 (e.g., the energy and does should be set so that not much dopants, if any, penetrates through the silicide to the underlying substrate). Depending upon the thickness of the silicide layer 18, ion implant beam energies between roughly 5 KeV and 30 KeV may be used to achieve this purpose.

Figure 2:
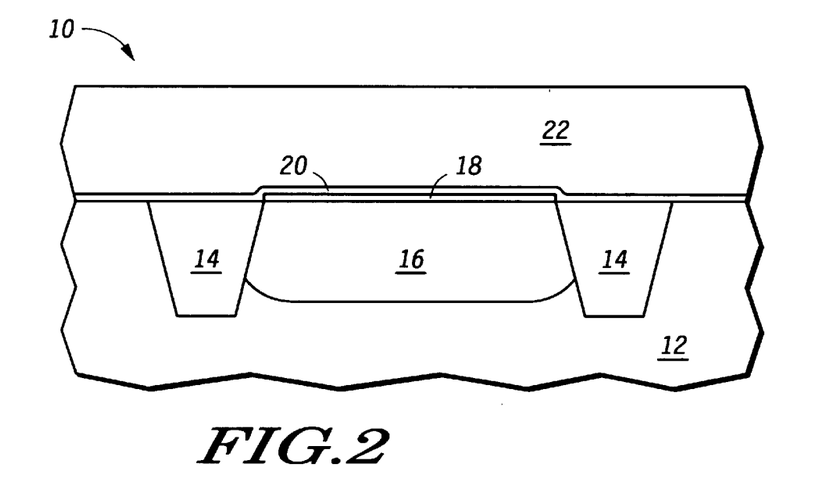

FIG. 2 illustrates that a thin plasma-enhanced nitride (PEN or like material) layer 20 is deposited overlying the trench isolation regions 14 and the silicide layer 18. Preferably, the plasma enhanced nitride layer is deposited to a thickness of roughly 500 angstroms. Plasma enhanced nitride layer 20 is provided for use as an etch stop layer when subsequently forming contact openings to source and drain electrodes of the MOS transistors. This etch stop therefore prevents over-etching of contact openings which could damage silicon/silicide contact regions. An oxide layer 22 is then deposited overlying a top portion of the plasma-enhanced nitride layer 20. It is important to note that the oxide 22 is preferably a low temperature oxide (LTO) due to the presence of the silicide layer 18. Furthermore, a low temperature oxide (LTO) layer 22 is preferred since a low temperature oxide will not result in substantial out diffusion of the dopant atoms contained within the doped silicide layer 18. Typically, the oxide layer 22 is deposited to a final thickness of roughly 1,000–4,000 angstroms with roughly 2,000 angstroms being preferred. In another form, the layer 22 may be formed as a tetraethylorthosilicate (TEOS) layer or an ozone TEOS layer either alone or in combination with another material to form a composite dielectric 22.

Figure 3:
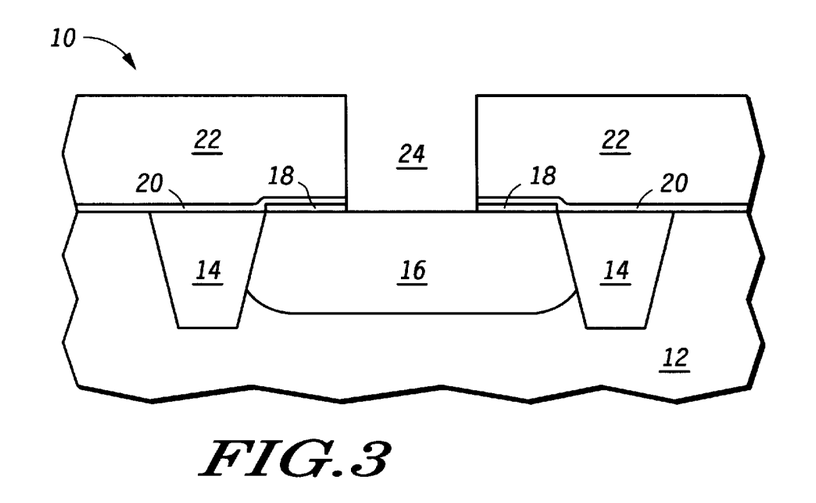

In FIG. 3, a photoresist mask (not specifically illustrated in FIG. 3) is deposited and developed over a top of the oxide layer 22. The photoresist mask is processed to form an opening 24. This opening 24 is extended into the oxide layer 22 to form an opening 24 through the oxide layer 22 via an oxide etch process. Typically, this etch is performed using a $CF_4$, Chlorine, and/or $CHF_3$ plasma reactive ion etch (RIE) environments. In all cases, the oxide etch utilized to form the opening 24 will preferably use the plasma enhanced nitride (PEN) layer 20 as an etch stop. After deepening of the opening through the oxide 22, the exposed portion of the plasma enhanced nitride 20 within the opening 24 is removed by using a silicon nitride etch. Typically, an $NF_3$ plasma etch environment is used to reactive ion etch (RIE) exposed portions of the plasma enhanced nitride layer 20 within the opening 24. After etching of the exposed portion of the plasma enhanced nitride (PEN) layer 20, an exposed portion of the silicide layer 18 within the opening 24 is etched away. Typically a brief wet etch ambient is used to remove exposed portions of the silicide region 18 in the opening 24. In a preferred form, piranha may be utilized to remove the exposed portions of the layer 18. In other embodiments, other wet etch technology and/or a dry etch process may be utilized to perform the etching of exposed portions of layer 18.

After completion of the etching illustrated in FIG. 3, the photoresist mask layer(not specifically illustrated in FIG. 3) is removed and an opening 24 remains in the structure 10. The opening 24 exposes a portion of the well region 16 as shown in FIG. 3. It is important to note that the opening 24 has now segmented the layer 18 into two different physically-separated portions. A left portion of layer 18 in FIG. 3 will be utilized to form one source/drain electrode whereas a right portion of layer 18 in FIG. 3 will be utilized to form the other source/drain electrode for a same MOS transistor. These two source and drain electrodes are electrically disconnected by the opening in a preferred form, but may be connected if a MOS capacitor structures (e.g., a two terminal, and not a three terminal, device) is all that is desired.

Figure 4:
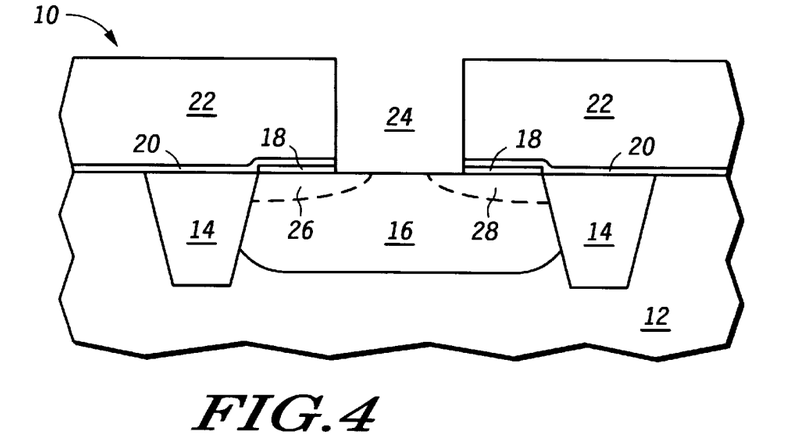

FIG. 4 illustrates that a thermal drive process is utilized to drive the dopant atoms out of the two silicide regions 18 in FIG. 4 to form respective source and drain electrodes 26 and 28 within single crystalline silicon areas. This drive process is typically performed at a temperature between 800° C. and 1000° C. for roughly 30 to 90 seconds. Notice that the source and drain electrodes 26 and 28 are formed fully self-aligned to the opening 24 of FIG. 4 since the opening defines the placement of the silicide region 18. The regions 26 and 28 are typically driven downward to 1,500–2,000 angstroms in depth and will laterally diffuse roughly 1,000 to 1,500 angstroms in distance. A doping concentration of the regions 26 and 28 tends to be on the order of $n \times 10^{19}$ to $m \times 10^{20}$ dopant atoms per centimeters cubed where n and m are any real numbers. As is clearly illustrated in FIG. 4, the silicide regions 18 remain as a portion of the source and drain electrodes whereby a conductivity of these silicon source/drain electrodes is improved.

Figure 5:
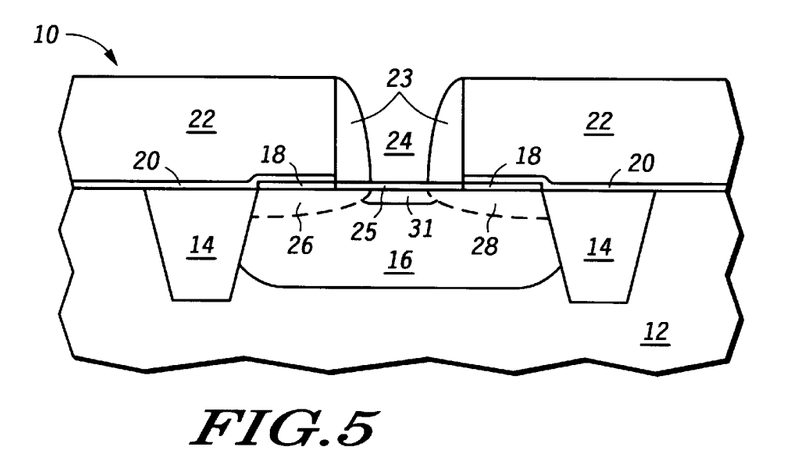
Figure 6:
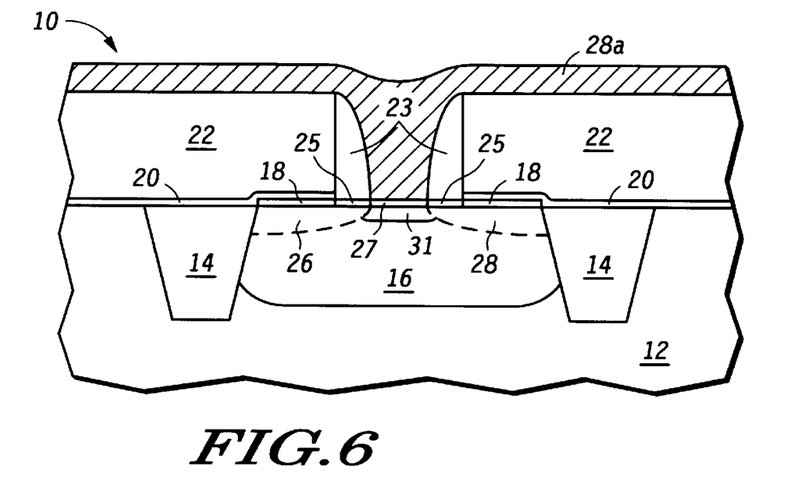

FIG. 5 illustrates that a sacrificial oxide 25 is thermally grown over a substrate surface which is exposed by the opening 24. The sacrificial thermal oxide 25 is typically grown to a thickness of roughly 100 angstroms. After formation of the sacrificial oxide 25, silicon nitride is deposited and reactive ion etched to form silicon nitride spacers 23 on top of the sacrificial oxide 25. The etch used to form silicon nitride spacers 23 is selective to the sacrificial oxide 25. After formation of the spacers 23, a threshold (Vt) adjust implant is performed at a low ion implant energy in order to form threshold adjust doped region 31 within the well region 16. Punchthrough avoidance ion implants may also be performed at this time. After formation of the threshold adjust region 31, an oxide etch is utilized to remove portions of the sacrificial oxide 25 which lie within an inner periphery of the spacer 23. Notice that the spacers 23 provides a necessary offset not only to compensate for lateral diffusion of the source and drain regions 26 and 28, but to electrically isolate subsequent gate electrode formations from the silicide regions 18 whereby Miller effects may be reduced. While nitride spacers formed by deposition may be replaced or composited with a sidewall thermal growth, some silicides do not oxidize effectively and may at least some deposition process to obtain adequate source/drain to gate isolation.

After formation of the spacers 23 and the etching of the sacrificial oxide layer 25, thermal gate oxidation to form a thermal gate oxide 27 is performed. In addition, the oxide 27 may be formed as a composite dielectric consisting of a thermally grown layer and a deposited oxide layer which may be optionally nitrided and/or fluorinated. Also, the composite-deposited oxide portion may be replaced with a deposited nitride layer and/or a high-k dielectric material such as a metal oxide. After formation of the gate oxide 27, a metal deposition process is utilized to form a metal layer 28a in FIG. 6. Preferably, layer 28a is made of one or more of molybdenum (Mo), tungsten (W), tungsten silicide ($WSi_2$), nickel silicide ($NiSi_2$), titanium nitride (TiN), composites thereof, or like materials. The thickness of layer 28a should be thick enough to adequately fill the opening 24 of FIG. 5.

Figure 7:
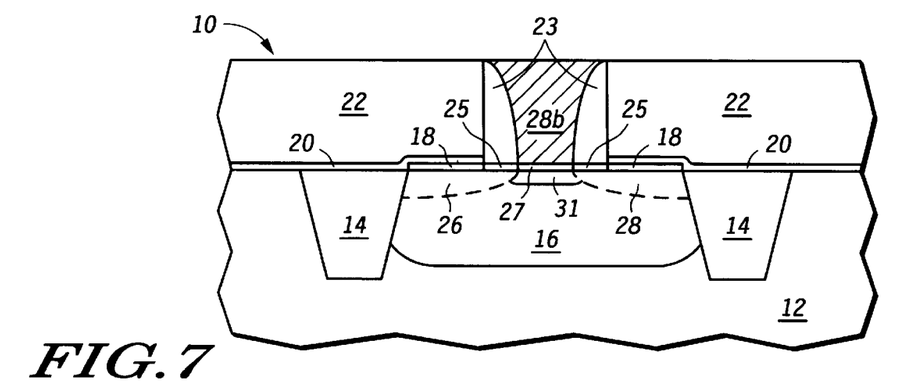

FIG. 7 illustrates that a chemical mechanical polish (CMP) process, a resist etch-back (REB), and/or a blanket etch-back process is used to remove an upper portion of layer 28a. The chemical mechanical polishing (CMP) or planarization process of FIG. 7 results in the formation of a metal plug 28b by removing top portions of the layer 28a. This metal plug 28b substantially or entirely fills the opening 24 illustrated in FIG. 5. The metal region 28b functions as a metallic gate electrode for the semiconductor device 10. It is important to note that the metal electrode 28b is self-aligned to the source and drain electrodes 26 and 28 illustrated in FIG. 7 by virtue of being formed within the self-aligning opening 24. Also, a photoresist mask and oxide/plasma enhanced nitride etch process is utilized to subsequently form source and drain contacts to the source and drains of FIG. 7 (not specifically illustrated). These source/drain contacts may be formed after metal gate formation or may be formed concurrent with the metal gate formation whereby the source/drain contacts are made of the same material as the metallic gate in an inlaid or dual inlaid manner (see FIGS. 8–9).

It is important to note that the metal material 28b is preferably a material having a mid-gap work function wherein the threshold voltages ($V_t$) of both p-type and n-type transistors on the same substrate are compatible. Furthermore, due to the presence of a metal gate, the threshold adjust region 31 may either be avoided or reduced in doping concentration whereby high mobilities through the channel regions can be achieved. The metallic gate electrode 28b has a higher conductivity than conventional polysilicon gate electrodes. Furthermore, the metallic electrode 28b of FIG. 7 will not suffer from polysilicon depletion whereby the effective thickness of the oxide 27 is not adversely affected. Furthermore, the metal gate 28b allows the gate oxide 27 to be formed as a tantalum pentoxide ($Ta_2O_5$) layer, titanium oxide ($TiO_2$) layer, other high-k dielectrics, or composites thereof which is not easily integrated into a process flow which uses polysilicon gate electrodes. Furthermore, the substrate 12 of FIG. 7 may be provided as a silicon on insulator (SOI) substrate whereby the control of threshold voltages can be accurately achieved using the metallic gate 28b taught herein.

It is important to note that the metal gate 28b in the process of FIGS. 1–7 need not be exposed to any high temperature processing whereby the metal gate will not be substantially damaged. Even though films, such as tungsten (W) and molybdenum (Mo), cannot adequately block ion implantation of source and drain atoms, this ion implantation blocking property of the gate electrode is not needed when utilizing the self-aligned process taught herein (i.e., the source and drain electrodes in FIGS. 1–7 need no gate electrode ion implant blocking properties in order to be properly formed). Furthermore, metallic adhesion of the metal gate 28b to surrounding oxides is improved over prior art devices, and no difficult metallic etch processing is needed in the device of FIG. 7. Also, the structure of FIG. 7 will avoid or significantly reduce any metal-to-gate-oxide interaction which could substantially degrade MOS transistor performance. These advantages are also present in the other embodiments taught herein in FIGS. 8–18.

FIGS. 8–9 illustrate a method which may be utilized to form a metal gate MOS transistor utilizing dual inlaid interconnect structures. FIG. 8 illustrates a semiconductor device 11 having regions 12–26 which are identical or substantially similar to similarly numbered elements in FIGS. 1–7. Due to the similarities of these elements to previously-discussed elements, these elements 12–26 in FIGS. 8–18 are not further discussed hereinbelow. FIG. 8 illustrates that a plasma enhanced nitride (PEN) or like etch stop layer 30 is formed overlying the low temperature oxide (LTO) 22 previously taught. Another low temperature oxide or TEOS layer 32 is then deposited overlying the etch stop layer 30.

A first photoresist mask (not specifically illustrated in FIG. 8) is used to form an opening 34 through the layer 32. This opening 34 is then extended through exposed portions of the etch stop 30 using a second plasma etch environment. The etch of layer 32 is preferably performed selective to the etch stop layer 30, and the etch of layer 30 is preferentially performed substantially selective to layer 22. A width dimension X of the opening 34 through the layers 32 and 30 is illustrated in FIG. 8. In one embodiment, the photoresist used to form X is removed and a photoresist having the dimension Y is formed and the openings 36 (in layer 32) and the deepening of the layer 34 (into layer 22) are performed together in FIG. 9. In another embodiment, the photoresist used to define the feature X in FIG. 7 may be used to etch through the layer 30 and 22 to fully deepen the opening 34 through the layer 22 before patterning the photoresist to the dimension Y. In either process, a "via first" inlaid trench process is shown in the embodiment of FIGS. 8–9. After formation of the opening 34, the photoresist layer used to pattern 34 is stripped from the surface of structure 11 and a second photoresist mask is utilized to define a second opening having a width dimension Y as illustrated in FIG. 8.

FIG. 9 illustrates that the photoresist mask which contains the opening dimension Y is utilized to etch a wider opening having a dimension Y through the layers 32 and 30 above the opening having the dimension X. In addition, the opening 34 is either previously etched as discussed with respect to FIG. 8 through layer 22 or is now deepened to penetrate through the layer 22 and expose the plasma enhanced nitride (PEN) layer 20. A nitride etch is then utilized to remove portions of the nitride layer 20 and the nitride layer 30 which are exposed within the dual inlaid openings. It is important to note that the etch used to from the gate opening X in FIG. 8–9 is also used to form dual inlaid source and drain contacts to regions 26 and 28 (these additional openings are not specifically illustrated in FIGS. 8–9 for simplicity). In essence, the dual inlaid gate 34 of FIG. 9 may be coupled to another gate and/or one or more source and drain electrodes of another device on the IC via the interconnect portion 36 of FIG. 9. After removal of the layer 20 within the opening 34, a wet silicide etch process is utilized to remove exposed portions of the region 18 to result in segmented source and drain regions as previously discussed for FIGS. 1–7. Note that the silicide/salicide regions of any exposed source and drain contacts are protected by photoresist during this gate-hole silicide strip operation (not shown ion FIG. 9) to remove silicide in channel region but maintain silicide in exposed source/drain regions.

After segmenting of the regions 18 via silicide etching, sacrificial gate oxide processing and sidewall spacers 38 and 40 are performed. Spacers 38 and 40 are formed by depositing a conformal layer of silicon nitride and reactive ion etching (RIE) the layer to form both the spacers 38 and 40 simultaneously. After sacrificial oxide processing, a gate oxide 27 is thermally grown. A deposited gate oxide 27 may be used to form a composite gate dielectric, however, this composite formation may require that a second masking operation and oxide etch process be utilized to clear exposed silicide source and drain regions to which the dual inlaid interconnect is to couple.

After formation of the gate oxide 27, the deposition of a metallic material is performed. This metallic material, as taught herein, is then chemically mechanically polished (CMP) or etched back to result in a metallic plug 36. A lower portion of the metallic region within region 34 functions as a gate electrode for a transistor or functions as a capacitor electrode for a capacitor. A top portion of the metallic plug 36 functions as a local interconnect which couples the lower metallic electrode within opening 34 to another active device on the integrated circuit (IC). This metallic interconnect dual inlaid structure has a lower resistance than conventional polysilicon interconnects.

Figure 10:
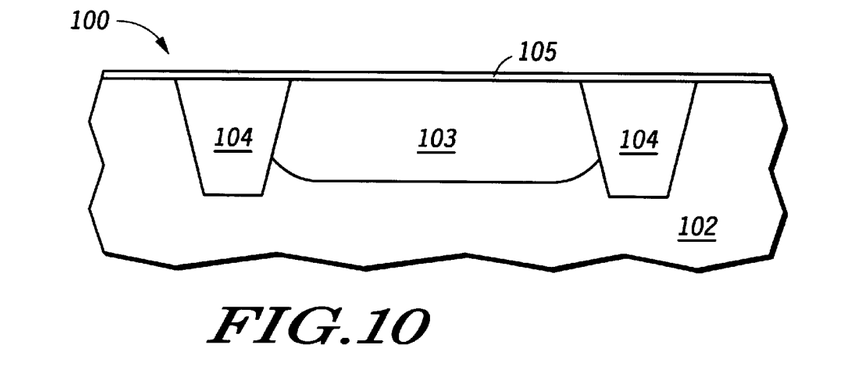
FIGS. 10–18 illustrate, in cross-sectional diagrams, an alternate embodiment for forming a metal gate MOS transistor in accordance with the present invention.

FIGS. 10–18 illustrate another embodiment for forming a metal gate MOS transistor in a self-aligned manner. FIG. 10 illustrates a semiconductor device 100 having a substrate 102. Trench isolation regions 104 are formed as discussed herein with respect to FIG. 1. Doped well regions 103 (at least one of n-type well regions or p-type well regions) are also formed to enable CMOS device formation as is discussed herein. A sacrificial thermal gate oxide 105 is formed in FIG. 10 and subsequently removed to clean an active surface within the well regions 103.

Figure 11:
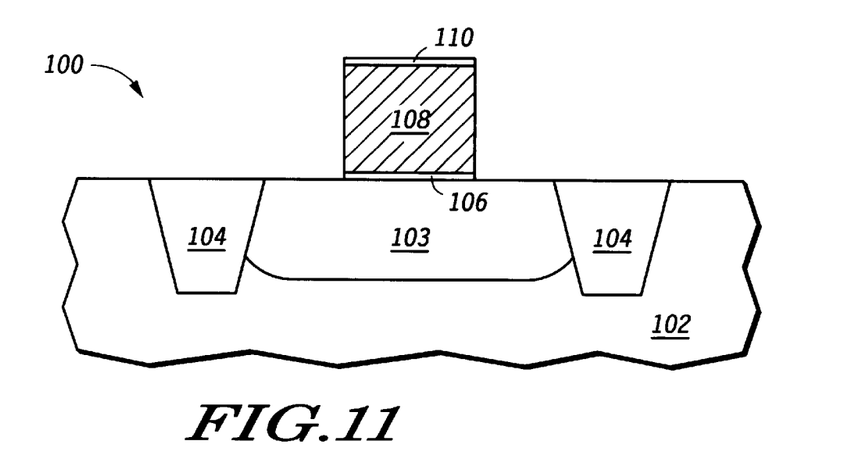
Figure 12:
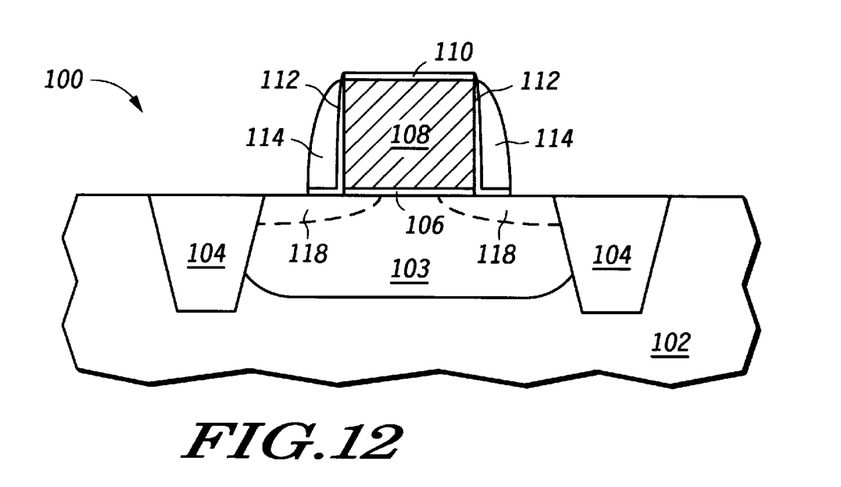

FIG. 11 illustrates that a gate oxide 106 is formed after removal of the sacrificial oxide 105. A polysilicon layer 108 is formed over the gate dielectric 106. An anti-reflective coating (ARC) layer 110 is formed overlying the polysilicon layer 108. A photoresist mask (not specifically illustrated in FIG. 11) is spun on the semiconductor wafer and developed in order to etch a gate stack from the layers 106 through 110 as illustrated in FIG. 11. After formation of the gate stack in FIG. 11, FIG. 12 illustrates that a gate sidewall oxidation 112 is performed. After completion of a sidewall oxidation 112, silicon nitride spacers 114 are formed laterally adjacent the gate stack in FIG. 12. Conventional source and drain ion implantation and lightly doped drain (LDD) processing is then utilized in FIG. 12 to form source and drain electrodes 118 in a self-aligned manner.

Figure 13:
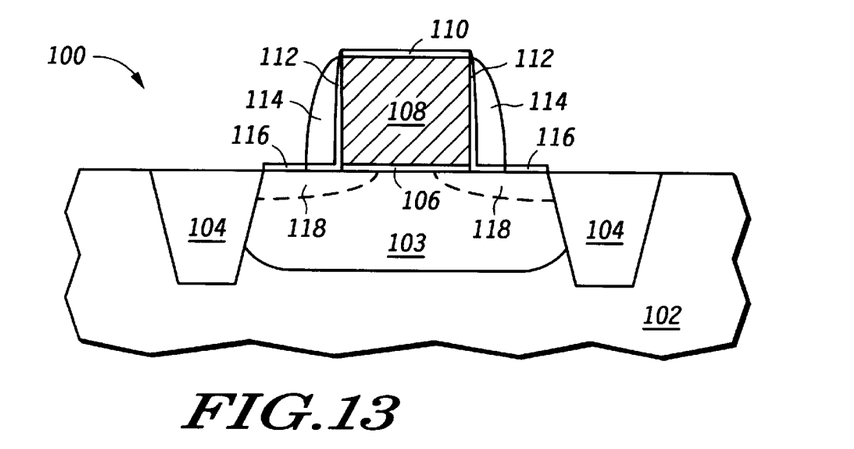

After formation of source and drain regions, FIG. 13 illustrates that a refractory metal layer is deposited over the wafer. A thermal process is initiated to react the refractory metal with the exposed silicon source and drain regions to form an upper silicide layer 116 as a portion of the source and drain regions. This silicide layer 116 is preferably cobalt silicide or titanium silicide. A silicide layer is not formed on top of the polysilicon layer due to the presence of the anti-reflective coating 110.

Figure 14:
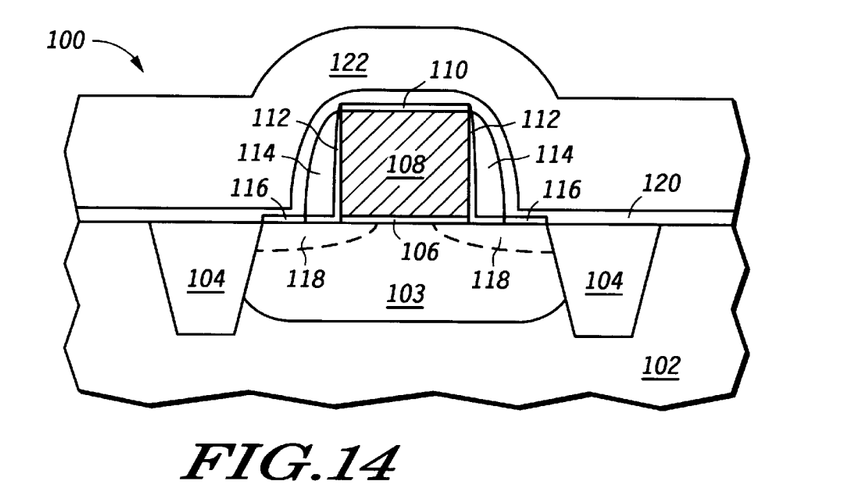
Figure 15:
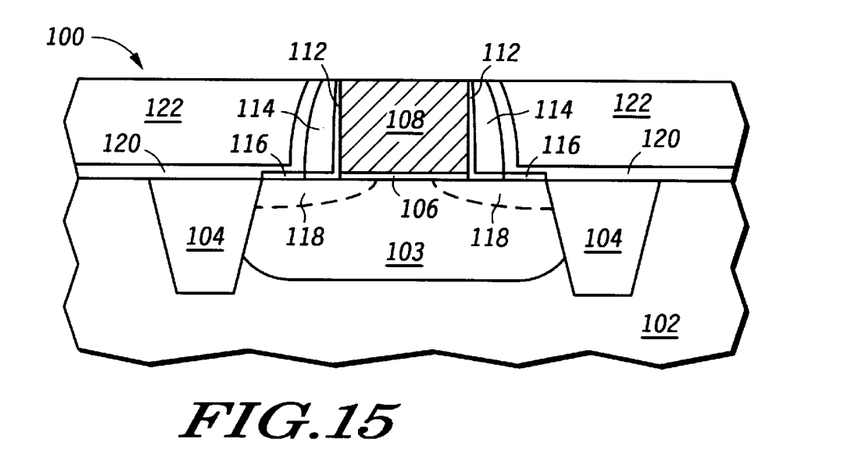

FIG. 14 illustrates that a plasma enhanced nitride (PEN) layer 120 is formed overlying the semiconductor device 100. After formation of the plasma enhanced nitride layer 120, a TEOS layer 122 is formed. It is important to note that other materials such as a low temperature oxide (LTO), ozone TEOS, borophosphosilicate glass (BPSG), and/or the like may be used either alone or in combination with other materials to form the inter-level dielectric (ILD) 120/122 of FIG. 14. In FIG. 15, a chemical mechanical polish (CMP) process is used wherein the chemical mechanical polish uses the polysilicon layer 108 as a polish stop. This chemical mechanical polishing (CMP) process will therefore expose a top surface of the polysilicon layer 108 as illustrated in FIG. 15.

Figure 16:
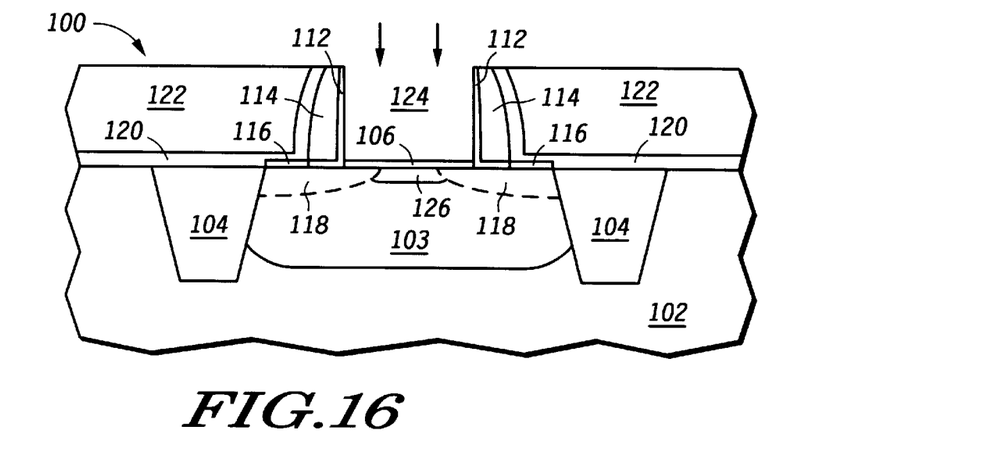

FIG. 16 illustrates that a plasma reactive ion etch (RIE) using chlorine or a wet polysilicon etch using conventional etch chemistry is utilized to remove the polysilicon layer 110 to form a feature opening 124. An ion implantation threshold (Vt) adjust implant and/or a punchthrough adjust ion implant is then optionally performed as needed through the feature 124 and the gate oxide 106 to form a threshold voltage doped region 126. Preferably, thermal oxide is used for sacrificial layer 106. However, any layer or composite which acts as an etch stop for polysilicon removal can be used. Oxide 106 is typically a sacrificial oxide which is removed and replaced with a gate oxide 125 which is either thermal silicon dioxide or of like composition to layer 106. In another form, layer 106 may comprise all or part of the final gate dielectric layer 125. High-k layers may also be used to form the dielectric layers 125 and 106.

Figure 17:
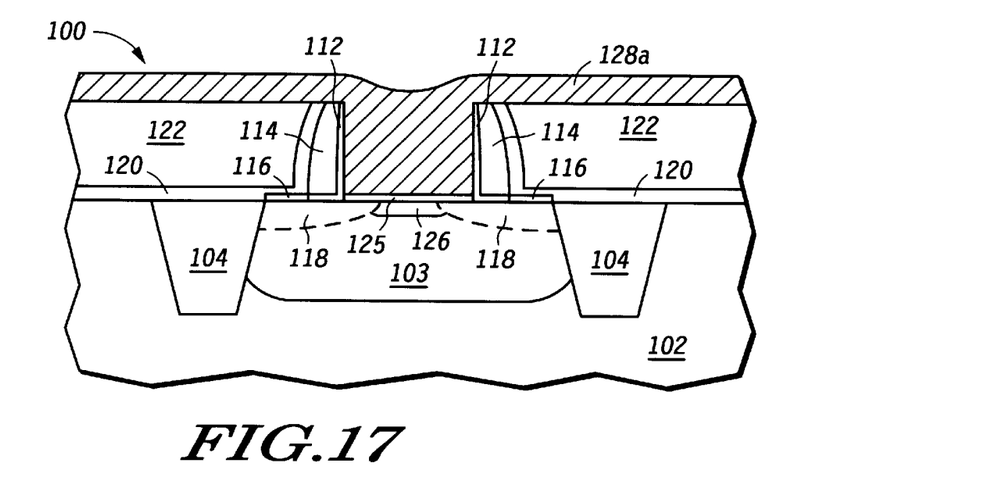

FIG. 17 illustrates that a metal deposition or sputtering process is utilized to form a layer of metal 128a which fills the feature size 124. As previously indicated, the metal material is preferably tungsten, molybdenum, titanium nitride, tungsten silicide, titanium silicide, like conductive layers, or composites thereof.

Figure 18:
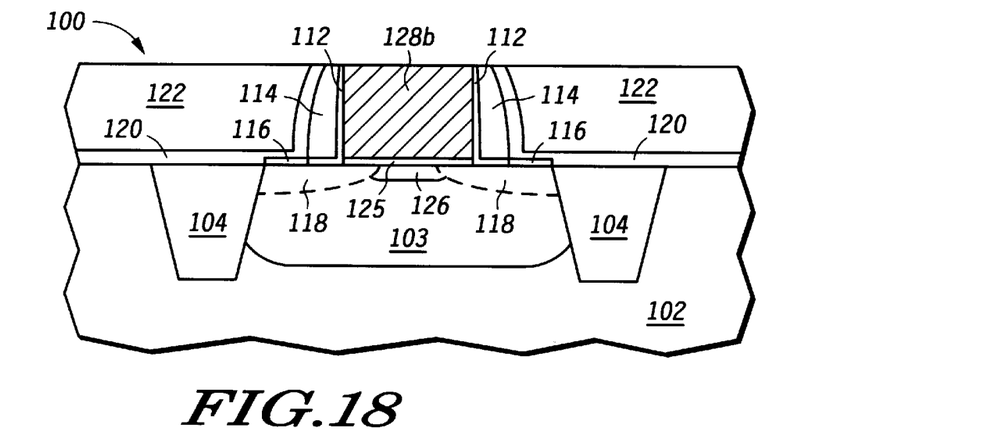

FIG. 18 illustrates that the metal layer 128a is chemical mechanical polished (CMP) to form a metal plug region 128b within the feature opening 124. It is important to note that the metal gate 128b is of a substantially similar dimension and location as the polysilicon gate 108 of FIG. 11. Therefore, the metal gate 128b is self-aligned to the source and drain regions 118 formed within the substrate as was the temporary polysilicon dummy gate region 108 of FIG. 12. Therefore, FIG. 18 illustrates the formation of a metal gate MOS transistor having all of the advantages discussed herein.

FIGS. 19–22 illustrate another embodiment for forming a self-aligned MOS transistor and a metallic interconnect layer in the same dielectric material. For this embodiment, FIGS. 10–16 illustrate the formation of the substrate with the sacrificial gate material removed.

Figure 19:
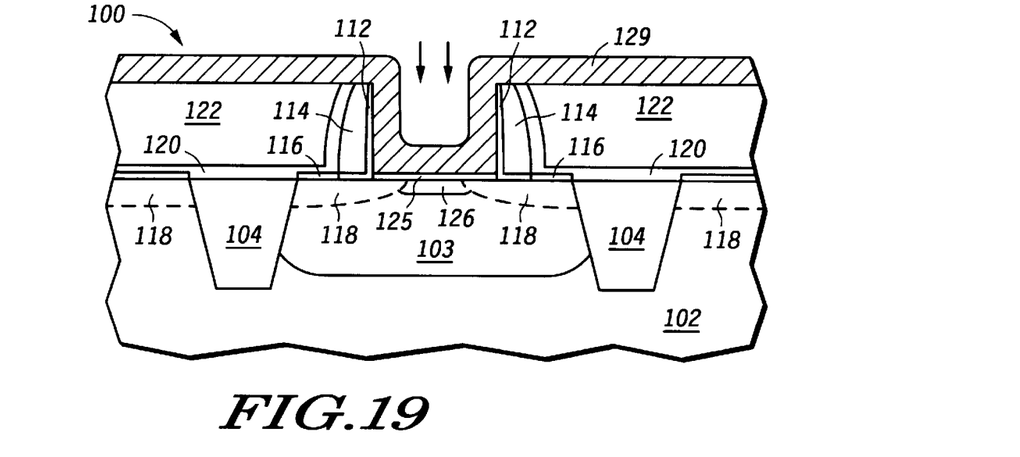
FIGS. 19–22 illustrate, in cross-sectional diagrams, an alternate embodiment for forming a metal gate MOS transistor and integrated metallic interconnect structures in the same layer in accordance with the present invention.

FIG. 19 illustrates that a metal deposition or sputtering process is utilized to form a thin layer of metal 129 which fills the feature size 124. As previously indicated, the metal material is preferably tungsten, molybdenum, titanium nitride (TiN), tungsten silicide, titanium silicide, like conductive layers, or composites thereof.

Figure 20:
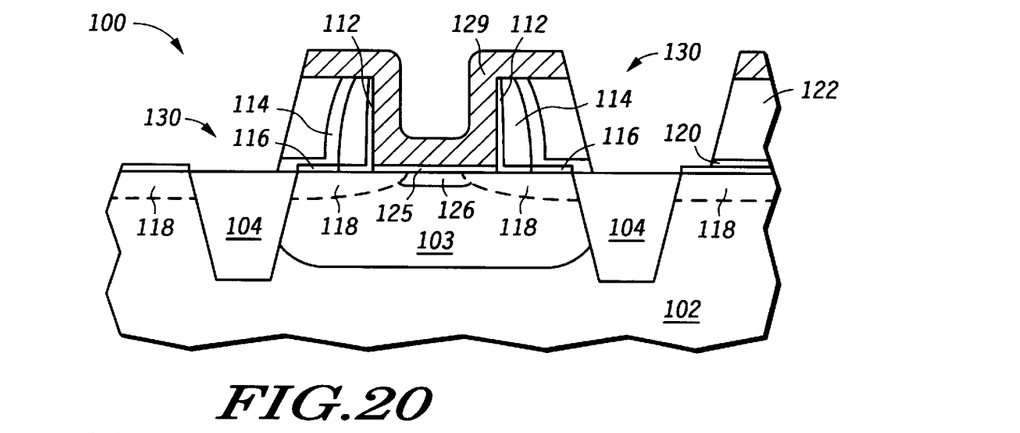

In FIG. 20, a photoresist mask (not specifically illustrated in FIG. 20) is spun on the semiconductor wafer and developed in order to etch an interconnect feature 130 through the layers 129, 122 and 120. In the alternative, the layer 129 may be polished in FIG. 20 before the openings are formed in FIG. 20. The etch of the openings in FIG. 20 stops on substrate 102 and may etch a small portion of the trench region 104.

Figure 21:
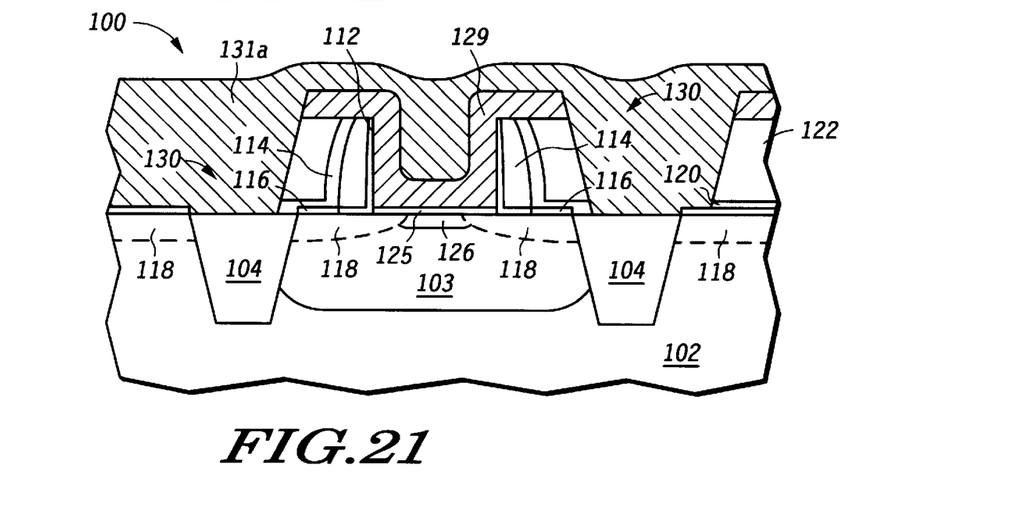

FIG. 21 illustrates that a metal deposition or sputtering process is utilized to form a layer of metal 131a which fills the feature size 124 and 130. As previously indicated, the metal material is preferably tungsten, molybdenum, titanium nitride, tungsten silicide, titanium silicide, like conductive layers, or composites thereof.

Figure 22:
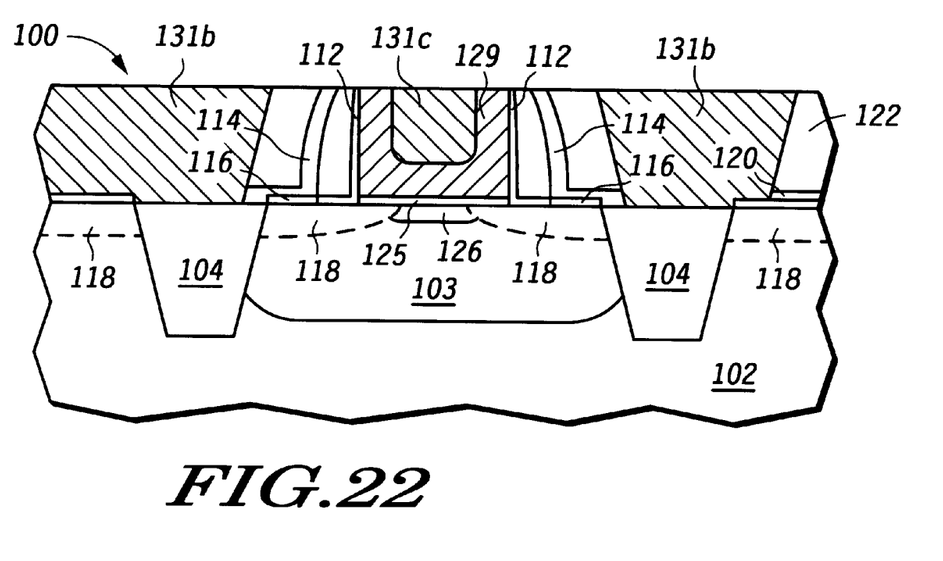

FIG. 22 illustrates that the metal layer 131a is chemical mechanical polished (CMP) to form a metal plug region 131b within the feature opening 124 and metal plug region 131c within the feature opening 130. It is important to note that the metal gate 131b is of a substantially similar dimension and location as the polysilicon gate 108 of FIG. 11. Therefore, the metal gate 131b is self-aligned to the source and drain regions 118 formed within the substrate as was the temporary polysilicon dummy gate region 108 of FIG. 12. Therefore, FIG. 22 illustrates the formation of a metal gate MOS transistor having all of the advantages discussed herein. Further, FIG. 22 illustrates the formation of a metallic interconnect having all the advantages discussed herein. Note that the metallic layers 129 and 131*a* may be polished in the same processing in FIG. 22 or may be polished separately (layer 129 being polished in FIG. 20 to form a first plug and layer 131*a* polished with a second CMP process in FIG. 22 to complete the plug structure. Note that regions 131*b* and 131*c* are coupled to other source and drain regions or other gate electrodes off-the-page of FIG. 22 by etching away the regions Although the invention has been described and illustrated with reference to specific embodiments, it is not intended that the invention be limited to those illustrative embodiments. Those skilled in the art will recognize that modifications and variations may be made without departing from the spirit and scope of the invention. For example, the invention taught herein may be used to make devices other than MOS devices, such as bipolar devices, capacitors, diodes, resistors, and the like. Therefore, it is intended that this invention encompass all of the variations and modifications as fall within the scope of the appended claims.

What is claimed is:

1. A method for forming a semiconductor structure, the method comprising the steps of:
   providing a semiconductor substrate;
   forming a feature over the semiconductor substrate wherein the feature is made of a semiconductive material;
   forming doped regions within the semiconductor substrate using the feature as a self alignment feature, the doped regions forming both a source region and a drain region for the semiconductor structure; and
   removing the feature to create an opening that contains no semiconductor material and filling the opening created by the removal of the feature with a metal material after the doped regions have been formed, the metal material forming a metal gate electrode of the semiconductor structure that is self-aligned to the source region and drain region.

2. The method of claim 1 further comprising:
   siliciding source and drain regions within the substrate before removing the feature.

3. The method of claim 1, wherein the method of forming a feature includes the substeps of:
   forming a sidewall spacer around the spacer wherein the metal gate electrode is formed laterally adjacent the spacer.

4. The method of claim 1, wherein:
   the step of forming a feature includes the substep of:
      forming a temporary gate structure as the feature through which source region and drain region self-alignment is obtained; and
   the step of filling the feature includes the substeps of:
      forming a dielectric layer adjacent to the temporary gate structure;
      removing the temporary gate structure; and
      filling the feature with the metal material.

5. The method of claim 1 wherein the step of forming doped regions comprises:
   forming a temporary gate region;
   ion implanting dopant atoms to form the source and drain regions wherein the source and drain regions are self-aligned to the temporary gate region;
   removing the temporary gate region to form a void region; and
   filling the void region with the metal material to form the metal gate electrode wherein the metal gate electrode is substantially similar in dimensions to the temporary gate region.

6. A method of forming a semiconductor structure, wherein the method comprises the steps of:
   providing a semiconductor substrate;
   forming a dopant-containing region over the semiconductor substrate, the dopant-containing region containing dopant atoms;
   forming a dielectric layer over the dopant-containing region;
   forming an opening through the dielectric layer and the dopant-containing region to expose a portion of the semiconductor substrate;
   forming at least one doped region in the semiconductor substrate by thermally driving the dopant atoms from the dopant-containing region into the semiconductor substrate, the at least one doped region being self-aligned to at least one edge of the opening; and
   filling the opening with a metal to form a metal gate region.

7. The method of claim 6, wherein the step of forming a doped region further comprises:
   forming a drain region and a source region as the at least one doped region; and
   the step of filling the opening further comprises:
      filling the opening with a metal to form a metal gate electrode which controls current conduction between the source region and the drain region.

8. The method of claim 6, wherein the step of forming the dopant-containing region further composes:
   forming the dopant-containing region from one of a group of a cobalt silicide region, a nickel silicide region, or a titanium silicide region.

9. The method of claim 6 further comprising the step of:
   forming a spacer along a vertical portion of the opening prior to the step of filling the opening with the metal.

10. The method of claim 6 further comprising the step of:
    forming a well implant region by ion implanting through the opening.

11. The method of claim 6 further comprising the step of:
    forming a threshold adjust region by ion implanting dopant atoms through the opening.

12. The method of claim 6 further comprising the step of:
    forming a well implant prior to the step of forming the opening.

13. The method of claim 6, wherein the step of forming a dopant-containing region further composes the step of:
    forming a dopant-containing region including a dopant by driving the dopant from the dopant-containing region using thermal diffusion where the dopant is selected from a group consisting of: arsenic, boron and phosphorous.

14. The method of claim 6, wherein the step of forming a dopant-containing region further composes the step of:
    forming a dopant-containing region by thermal diffusing both arsenic and phosphorus from the dopant-containing region to form a lightly doped drain (LDD) structure.

15. The method of claim 6 further comprising the step of:
    forming a gate dielectric region over the semiconductor substrate exposed by the opening.

16. The method of claim 6, wherein the step of forming a dielectric region further comprises:

forming a high-k dielectric region as the dielectric layer, wherein the high-k dielectric region has a dielectric constant of greater than approximately 5.0.

17. The method of claim 16, wherein the step of forming a dielectric region further comprises:

forming the high-k dielectric region using a material selected from a group consisting of: $TiO_2$ or $Ta_2O_5$.

18. The method of claim 6 further comprising the step of:

forming a sacrificial oxide after the step of forming an opening and before forming a gate oxide.

19. The method of claim 6, wherein the step of filling the opening further comprises:

filling the opening with a metal to form a dual inlaid structure wherein dual inlaid structure includes the metal gate region and a metallic interconnect portion.

20. The method of claim 6, wherein the step of filling the opening further comprises:

filling the opening by depositing a metal material and polishing the metal material using one of a chemical mechanical polishing process and an etch back process.

21. The method of claim 6, wherein the step of forming a dielectric layer further comprises:

forming the dielectric layer as a composite layer comprising silicon nitride and an oxide.

22. The method of claim 6, wherein the step of forming an opening further comprises:

etching the dielectric layer by using a plasma etch and etching the dopant-containing region by using a wet etch.

23. The method of claim 6, wherein the step of forming a dopant-containing region further comprises:

using the opening to segment the dopant-containing region into a plurality of segmented regions; and doping, by ion implantation, a first set of the plurality of segmented regions with an N-type dopant atom and doping a second set of the plurality of segmented region with a P-type dopant atom.

24. The method of claim 6, wherein the step of forming a dopant-containing region further comprises:

using the opening to segment the dopant-containing region into a source region and a drain region wherein the source and drain regions are segmented from one another by the opening.

25. A method of forming a semiconductor structure, wherein the method comprises the steps of:

providing a semiconductor substrate;

forming a temporary feature having a first side and a second side over the semiconductor substrate;

forming a first doped region in the semiconductor substrate directly adjacent to the first side of the temporary feature and a second doped region in the semiconductor substrate directly adjacent to the second side of the temporary feature;

forming a dielectric layer over the semiconductor substrate;

planarizing a top surface of the dielectric layer to expose a top portion of the temporary feature while leaving bottom-most regions of the dielectric layer on the surface of the semiconductor structure;

removing the temporary feature to form an opening in the dielectric layer; and filling the opening with a metal to create a metal gate electrode.

26. The method of claim 25, wherein the step of planarizing further comprises:

planarizing the top surface by polishing the top surface by using one of a chemical mechanical polishing process or an etch back process.

27. The method of claim 25, wherein the step of removing the temporary feature further comprises:

removing the temporary feature by one of a wet etch process and a dry etch process.

28. The method of claim 25, wherein the step of forming a temporary feature further comprises:

forming the temporary feature wherein the temporary feature includes one of a polysilicon and an amorphous silicon.

29. The method of claim 25, wherein the step of forming a first doped region further comprises:

forming the first doped region and the second doped region by ion implantation in a self aligned manner.

30. The method of claim 25, further comprising the step of:

forming a sidewall spacer on a vertical portion of the temporary feature.

31. The method of claim 25, wherein the step of filling the opening further comprises:

filling the opening with a metal to form a metal gate and an interconnect region in a dual inlaid structure.

32. A method of forming a semiconductor structure, wherein the method comprises the method of:

providing a semiconductor substrate;

forming a self-alignment feature over a portion the semiconductor substrate;

implanting a first region of the semiconductor substrate with a dopant; and forming a metal gate, whereby no polysilicon region is directly adjacent a gate dielectric region, following the step of implanting, wherein the metal gate is formed substantially over the portion of the semiconductor substrate.

33. A method for forming a semiconductor structure, the method comprising the steps of:

forming a first dielectric layer;

forming an etch stop layer over the first dielectric layer;

forming a second dielectric layer over the first dielectric layer;

etching a dual inlaid structure into the first and second dielectric layers wherein the first dielectric layer contains an opening defining a first portion of the dual inlaid structure and the second dielectric layer contains an opening defining a second portion of the dual inlaid structure wherein the opening in the second dielectric layer has a width dimension greater than a width dimension of the opening in the first dielectric layer; and forming a metallic electrical device electrode within the first portion of the dual inlaid structure and a metallic interconnect coupled to the metallic electrical device electrode within the second portion of the dual inlaid structure.

34. The method of claim 33, wherein the step of forming a metallic electrical device electrode includes forming the metallic electrode from selected from a group consisting of: tungsten (W), titanium nitride (TiN), molybdenum (Mo), tungsten silicide ($WSi_2$), and nickel silicide ($NiSi_2$).

35. The method of claim 33, wherein the step of forming a metallic electrical device electrode includes forming the metallic electrical device electrode overlying a gate oxide for a metal oxide semiconductor (MOS) transistor.

36. The method of claim 33, wherein the step of forming a metallic electrical device electrode includes the metallic electrical device electrode being a capacitor electrode.

37. The method of claim 33, wherein the step of forming a metallic electrical device electrode includes forming both the metallic electrical device electrode and the metallic interconnect by CMP after a single metal stack formation.

38. A method for forming a semiconductor structure, the method comprising the steps of:

provided a semiconductor substrate containing dielectric isolation regions;

forming a feature region over the semiconductor substrate;

forming doped regions within the semiconductor substrate using the feature region as a self alignment feature, the doped regions forming both a source region and a drain region for the semiconductor structure in a self-aligned manner to the feature region;

forming a gate dielectric layer within the feature region;

at least partially filling the feature region with a first metallic layer which overlies the gate dielectric layer;

polishing the first metallic layer to form a first metallic plug region within the feature region;

forming interconnect openings on top of the dielectric isolation regions within the semiconductor substrate;

forming a second metallic layer within the interconnect openings and any remaining portion of the feature region; and polishing the second metallic layer to form a second metallic plug regions in the interconnect openings and any remaining portion of the feature region.

39. The method of claim 33 wherein a gate dielectric region for an MOS transistor is formed within the opening in the first dielectric layer after formation of the openings in the first and second dielectric layers.

40. The method of claim 33 wherein source and drain silicide regions and a second etch stop layer are formed under the first dielectric layer.

41. The method of claim 33 wherein sidewall spacers are formed within inner circumferences of the openings in the first and second dielectric layers.

42. The method of claim 1 wherein a gate dielectric region is formed after removing the feature.

43. The method of claim 1 wherein a channel region ion implantation is performed after removing the feature.

* * * * *